United States Patent [19]
Ainsworth

[11] 3,825,772

[45] July 23, 1974

[54] CONTACT BOUNCE ELIMINATOR CIRCUIT WITH LOW STANDBY POWER

[75] Inventor: Richard Allan Ainsworth, Wappingers Falls, N.Y.

[73] Assignee: International Business Machines Corporation, Armonk, N.Y.

[22] Filed: May 25, 1973

[21] Appl. No.: 364,183

[52] U.S. Cl. .............. 307/247 A, 307/205, 307/215, 307/279

[51] Int. Cl.... H03k 3/286, H03k 3/33, H03k 19/08

[58] Field of Search.... 307/202, 205, 247 R, 247 A, 307/251, 279, 304, 215

[56] References Cited

UNITED STATES PATENTS

| | | | |
|---|---|---|---|
| 3,324,306 | 6/1967 | Lockwood | 307/247 A X |
| 3,388,265 | 6/1968 | Wright | 307/247 A X |
| 3,476,879 | 11/1969 | Zenner | 307/247 A |
| 3,508,079 | 4/1970 | Moll et al. | 307/247 A |
| 3,588,525 | 6/1971 | Hatsukano et al. | 307/247 A |
| 3,624,518 | 11/1971 | Dildy, Jr. | 307/247 A X |
| 3,668,432 | 6/1972 | Rhodes | 307/246 X |

FOREIGN PATENTS OR APPLICATIONS

| | | | |
|---|---|---|---|
| 17,701 | 11/1971 | Japan | 307/247 A |

OTHER PUBLICATIONS

Radzik, "Bouncing Switch Output to Single-Pulse Converter in Four-Phase Logic," IBM Tech. Discl. Bull., Vol. 14, No. 8, p. 2421-2422, 1/1972.

Kane, "FETS Make Digital Switching A Snap"; Electronic Design, (pub.), pp. 72-79, 11/8/1966.

*Primary Examiner*—Rudolph V. Rolinec
*Assistant Examiner*—L. N. Anagnos
*Attorney, Agent, or Firm*—Thomas F. Galvin

[57] ABSTRACT

A contact bounce eliminator circuit including a pair of cross-coupled field effect transistors connected across the input leads of a flip-flop circuit for discharging an input when the potential source is switched from one input to the other. Energy in the circuit is dissipated only until circuit reaches a quiescent state, assuring low power dissipation when the mechanical contact is actuated. Virtually no power is dissipated in the quiescent state.

13 Claims, 7 Drawing Figures

CONTACT BOUNCE ELIMINATOR CIRCUIT WITH LOW STANDBY POWER

BACKGROUND OF THE INVENTION

1. Field of the Invention

This invention relates to contact bounce eliminator circuits which assure that the operation of a mechanical switch or contact which has a tendency to bounce or chatter will generate a single electrical output pulse signal.

2. Description of the Prior Art

In many applications it is often necessary to actuate a high speed electronic circuit with a mechanical switch. However, in the closing of a switch the mechanical contacts tend to bounce, thereby generating a series of electrical pulses rather than the desired single output pulse.

As is well known, there are numerous circuits at the present state of the art which function quite well as bounce eliminator circuits in data processing systems such as electronic computers. A problem arises, however, when one attempts to use these circuits in electronic devices which are designed to function with batteries as the source of power, such as electronic watches, calculators and small display systems. This problem is particularly acute in the manufacture of electronic watches because the entire unit is expected to run for a full year on the power supplied by a 200 milliampere hour battery, which represents the best commercially available power supply. Thus, although presently available designs for bounce eliminator circuits are relatively economical, noise free and compatible with integrated circuit manufacture, they draw too much power for practical use in systems operating on small batteries.

SUMMARY OF THE INVENTION

It is therefore an object of this invention to reduce the power requirements of contact bounce eliminator circuits.

It is a further object of this invention to provide a circuit which is manufacturable using the most modern integrated circuit techniques to assure inexpensive manufacturing costs, compactness and long term reliability.

These and other objects are achieved by providing a pair of cross-coupled transistors connected across the inputs of a conventional flip-flop circuit. The transistors operate to discharge a previously charged input when the potential is switched from one input to another. After the mechanical switch has been actuated and the circuit returns to its quiescent state, the cross-coupled transistors assure that virtually no power is dissipated.

In the preferred embodiment of this invention the entire bounce eliminator circuit is constructed in metal oxide semiconductor field effect transistor (MOSFET) circuitry which can be constructed on a single semiconductor substrate. The flip-flop circuits, which are of logic designs known to the prior art, are constructed in complementary MOS (CMOS) technology. The cross-coupled transistors are enhancement mode devices of the same conductivity type, thereby assuring a contact bounce eliminator circuit which, as far as I am aware, has the lowest power drain of any such circuit.

DESCRIPTION OF THE PREFERRED EMBODIMENT

Figure 1:
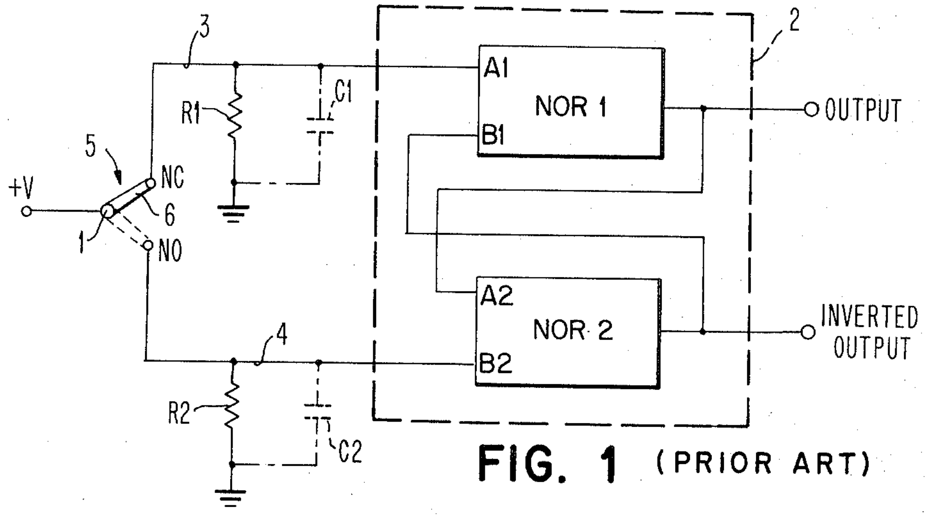
FIG. 1 (PRIOR ART)
FIG. 1 is a sehematic circuit diagram showing a prior art contact bounce eliminator circuit.

Prior to discussing my invention, a review of a typical prior art circuit as shown in FIG. 1 will lead to a better understanding of my invention.

In FIG. 1 a standard contact bounce eliminator is illustrated as a flip-flop circuit 2 having input leads 3 and 4 which are selectively connectible in alternate fashion through the switch 5 and terminal 1 to a source of potential, denoted as +V. The flip-flop operates as a means for generating a pair of signals having substantially equal and opposite waveforms. The outputs change state in response to the switching of the potential from one input to the other. Switch 5 is a mechanical device, ordinarily actuated manually, and is illustrated as a single pole, double throw (SPDT) type with break-before-make operation.

In the closing of a switch of this nature, strap 6 may touch and bounce open several times from nodes NC or NO before contact is made and held. Strap 6 may also bounce from a closed contact upon leaving the contact. This bouncing generates a string of pulses rather than a voltage shift as is desired. In the event that this occurs, the signals on the outputs of NOR 1 and NOR 2 remain in the same state, assuring a stable output. In effect, the cross-connected NOR blocks operate as a latch.

The normally open (NO) and normally closed (NC) contacts are usually so far apart that strap 6 will not bounce between the two. Once the strap touches the selected one of the stationary contacts it is impossible for it to recontact the other contact.

Resistors R1 and R2 are connected between the upper and lower inputs of flip-flop 2 and a source of reference potential, in this case a ground potential. Also illustrated in phantom lines are capacitances C1 and C2 connected in parallel across resistors R1 and R2, respectively. Thus, each of the two inputs to circuit 2 has attached to it an RC circuit which retains charge at the inputs A1 or B2 when a voltage which has been applied from a source of voltage +V is removed by operation of switch 5. The capacitance is commonly in the order of 10 picofarads, and results from the various stray capacitances which naturally occur in the circuit.

The choice of the value of resistors R1 and R2 is the source of a dilemma. For a fast discharge of the input connections to flip-flop 2 when +V is removed, resistors R1 and R2 should have a relatively low value to assure that the time constant (T = RC) of the circuit is as low as possible. On the other hand, if the value of the resistance is set low then there will be a substantial dissipation of power during the quiescent state of the circuit from the source +V through the switch and the resistor to ground. Conversely, if the resistor is set too high, the input associated with it will discharge too slowly or not at all. In addition, if the resistor is too large, leakage current within the circuit could cause unstable operation.

As previously discussed, the term "substantial power drain" in the case of small electronic devices may be in terms of microamperes because the total battery power is only around 200 milliampere hours. A typical example of this problem may serve to further elucidate the problem. In an electronic watch the manually operated switch for reading out desired time or calendar information from the watch face may take around five microseconds to make final contact to one of the straps NC or NO at which time the bounce eliminator circuit would discharge and return to its alternate stable state. The discharge current might be one microampere and, at a three volt input at +V, resistors R1 and R2 would be designed at three megohms each to assure the fastest discharge time. However, a three megohm resistor would also dissipate one microampere when the circuit was in its quiescent state. Obviously this is unacceptable, representing as it does a substantial portion of the total power available from the 200 milliampere -hour battery.

The discussion of the prior art circuit in the preceding paragraphs is meant to be illustrative of one prior device familiar to me. A similar device is illustrated on page 75 of the text Manual of Logic Circuits by Gerald A. Maley, Prentice Hall Publishers, 1970. The Maley contact bounce eliminator is in the form of NAND logic rather than the NOR logic shown in FIG. 1 and uses only a single resistor connected between a negative power supply and the contacts. However, the problem of a constant current draw in the quiescent state of the circuit is the same as described above.

Figure 2:
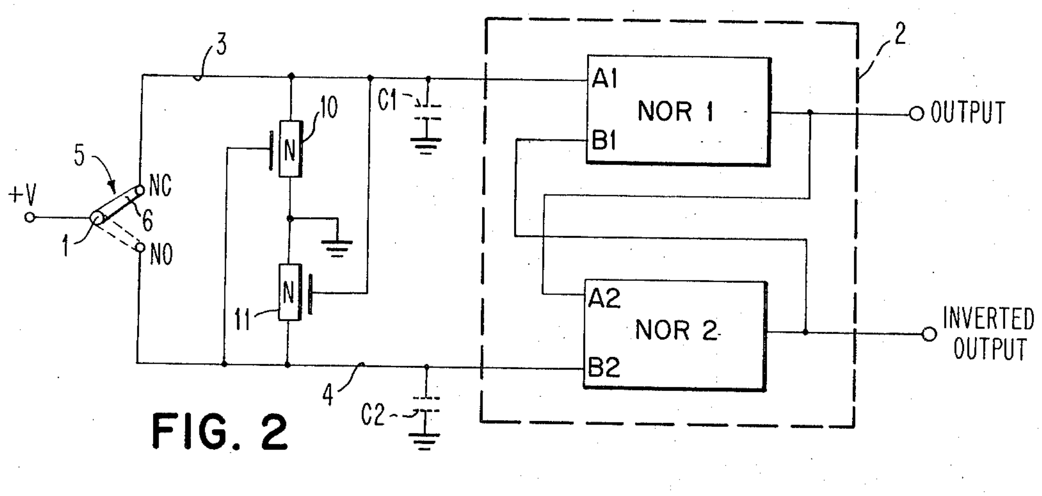
FIG. 2 is a schematic circuit diagram illustrating the significant difference between my inventive circuit and the prior art circuit of FIG. 1.

Turning now to FIG. 2 which illustrates one embodiment of my invention, it will be seen that the cross-connected NOR circuits in block 2 remain the same, as does the representation of mechanical switch 5. However, the resistors R1 and R2 have been replaced by a pair of N-channel field effect transistors 10 and 11. The devices are preferably enhancement mode type, as compared to depletion mode, so that a threshold voltage on the gate with respect to the source must be exceeded for the device to be conductive.

Transistors 10 and 11 are connected in crosscoupled fashion with the gate of each transistor being connected to a common terminal with the drain of the other transistor; the sources of the transistors are connected to a common reference point, in this case, ground. As will be understood by those of skill in the art, modern field effect transistors are symmetrical; and the terms "drain" and "source" have meaning only with respect to the particular biasing of the transistor. The polarity of potential source +V at terminal 1 with respect to the reference point at the common source node is selected so as to turn on one of the cross-coupled devices when the potential is applied to its gate electrode. For N channel devices the potential is positive with respect to the reference point (ground).

The advantage of this circuit over the prior art device described above can be fully understood by a thorough explanation of the operation of the circuit. Both of the NOR blocks are conventional in operation and are arranged in cross-connected fashion as a flip-flop circuit. Using the convention of positive logic, the truth table for a NOR block is shown below in Table 1. In comparing the truth table with the circuit in FIG. 2, a +V connection is defined as a logical 1 and/or grounded connection is defined as logical 0's. The overall operation of the circuit 2 is shown by Truth Table 11, where the NC and NO are input signals to terminals A1 and B2 of the NOR 1 and NOR 2 blocks, respectively, and the output signals are on the OUTPUT and INVERTED OUTPUT lines.

TABLE 1

| A1 | B1 | OUTPUT |
|---|---|---|
| 1 | 1 | 0 |
| 1 | 0 | 0 |
| 0 | 1 | 0 |
| 0 | 0 | 1 |

TABLE II

| NC | NO | OUTPUT | | INVERTED OUTPUT |
|---|---|---|---|---|
| 1 | 0 | 0 | | 1 |
| 0 | 0 | | MEMORY | |
| 0 | 1 | 1 | | 0 |
| 1 | 1 | | DON'T CARE | |

The NOR blocks are stable, i.e., with given inputs the output assumes the value designated by the boolean function of the block as shown in Table 1. But if, for example, center strap 6 in FIG. 2 switches the +V from contact NC to contact NO, then the logical input on terminal B2 of NOR 2 switches from 0 to 1, disposing the INVERTED OUTPUT line to switch from 1 to 0; and the input to terminal B1 follows the INVERTED OUTPUT. FET 10 is rendered conductive and discharges input A1. The inputs on NOR 1 are now A1 = 0, B1 = 0 and the OUTPUT line switches from 0 to 1; A2 follows the output and switches from 0 to 1 and the circuit is latched. Thus, up to this point, the OUTPUT terminal is at a logical 1 and the INVERTED OUTPUT terminal is a logical 0 and both signals are stable.

Assume now that strap 6 of switch 5 bounces or chatters, causing an open circuit between strap 6 and contact NO. The potential level at B2 remains at +3 volts until the node B2 is discharged. Discharge could occur, e.g., by current dissipation within the NOR blocks or by leakage current. In logical terms, at this point, NC = 0 and NO = 0 and A1 = B2 = 0. As shown in Table 11, this is a memory condition where both the OUTPUT and INVERTED OUTPUT signals remain the same. The reason for this is that even though the signal on terminal B2 changes from 1 to 0, the input on A2 nevertheless remains at 1; and the truth table in Table 1 indicates that the INVERTED OUTPUT line will remain at a logical 0.

Those interested in further details on the operation of this type of sequential logic circuit are referred to the text by R. E. Miller entitled "Switching Theory" Vol. 2: "Sequential Circuits and Machines", John Wiley and Sons Inc., 1965, pp. 10–12 and 228–229.

Having described the logical operation of flip-flop 2, the electrical operation of the circuit shown in FIG. 2 can now be profitably discussed. First consider quiescent operation, as strap 6 connects +V to terminal NC. Input A1 of NOR 1 is biased at +V and input B2 of NOR 2 is biased at ground through FET 11. The gate of N channel FET 11 and the drain of N channel FET 10 are biased positively; and the gate of FET 10 and the drain of FET 11 are at ground. FET 11 is thus biased in its conductive state and holds input B2 at ground. FET 10 is in its nonconductive state, there being no gate voltage present to turn it on. Thus, neither transistors 10 nor 11 draw any current in the quiescent state. The potential path from +V to ground is blocked because transistor 10 is non-conductive. The other path through FET 11 draws no current because both the source and drain of conductive transistor 11 are at the same potential, neglecting leakage current from NOR 2.

When switch 5 is actuated, bringing center strap 6 into contact with terminal NO, +V is applied to the gate of transistor 10, turning it on. The charge at terminal A1 of NOR 1 is discharged through FET 10. The positive potential at A1 also causes FET 11 to conduct current until conductive FET 10 discharges node A1 to the threshold voltage of FET 11, at which time the latter becomes nonconductive. The only criterion for this operation is that center strap 6 remain long enough at NO for the discharge to occur and for the output of NOR 1 to change state from a logical '0' to '1'. Thereafter the contact can bounce and the outputs will remain stable.

Figure 3:
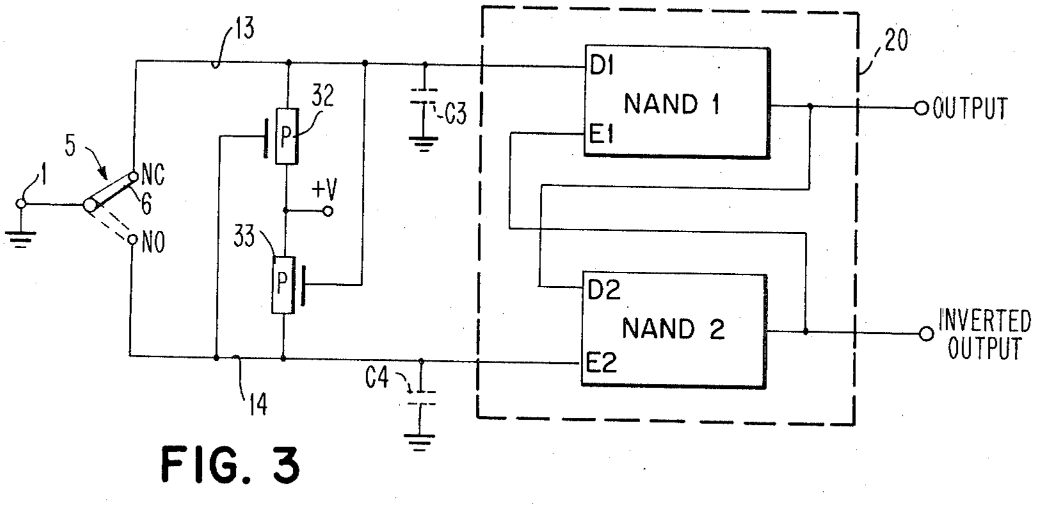
FIG. 3 is an alternate embodiment of my inventive circuit illustrated in FIG. 2 which uses cross-connected NAND gates and cross-coupled P-channel devices.

FIG. 3 illustrates an embodiment of my invention using cross-coupled P-channel transistors and cross-connected NAND circuits as the flip-flop. As previously mentioned, the text by Maley illustrates a contact bounce eliminator showing a similar circuit except that a resistor is used in conjunction with a negative potential source rather than the cross-coupled field effect transistors of my invention.

The truth table for a NAND block is shown below in Table 3. As with the prior tables, a +V connection is defined as a logical 1 and ground is defined as a logical 0. The overall operation of the circuit in FIG. 3 is shown in Truth Table 4.

Table III

| D1 | E1 | OUTPUT |
|---|---|---|
| 1 | 1 | 0 |
| 1 | 0 | 1 |
| 0 | 1 | 1 |
| 0 | 0 | 1 |

Table IV

| NC | NO | OUTPUT | | INVERTED OUTPUT |
|---|---|---|---|---|
| 0 | 1 | 1 | | 0 |
| 1 | 1 | | MEMORY | |
| 1 | 0 | 0 | | 1 |
| 0 | 0 | | DON'T CARE | |

In operation, center strap 6 initially connects the ground potential at node 1 to contact NC. Thus, a logical 0 is connected to input D1 of NAND 1. The ground potential biases P-channel transistor 33 on, thereby providing a path from the positive source +V along conductor 14 to the input E2 of NAND 2, i.e., a logical 1. As can be seen from Table 3 the output from NAND 2 must be zero; therefore, the input to E1 is also 0 and the output from NAND 1 is 1. This output is fed to input D2 of NAND 2. Thus, all input and output signals are in the stable state. If strap 6 bounces or chatters from contact NC, causing an open circuit in the system, input D1 of NAND 1 could drift, depending on the circuit family used in the NAND circuits. However, this causes no change on the output line because the NAND function guarantees that the output remains at the logical 1 level as long as D1 remains at logical 0.

The electrical operation of the circuit of FIG. 3 is analogous to that described with reference to FIG. 2. With strap 6 connected to contact NC, P-channel FET 33 is biased on, thereby connecting the positive potential to terminal E2 of NAND 2. The input of FET 32 is biased at +V and rendered nonconductive. Thus, as with N-channel transistors 10 and 11 in FIG. 2, neither transistor 32 nor 33 draw any current in the quiescent state for essentially the same reasons. When switch 5 is actuated, switching strap 6 into contact with node NO, ground is applied to the gate of FET 32 and the drain of FET 33. Any charge at terminal E2 of NAND 2 is discharged to ground through NO. The ground potential also causes FET 32 to conduct current until node D1 is charged to 3V. FET 33 conducts until node D1 is charged to one threshold below 3V at which time it is cut off.

Figure 4:
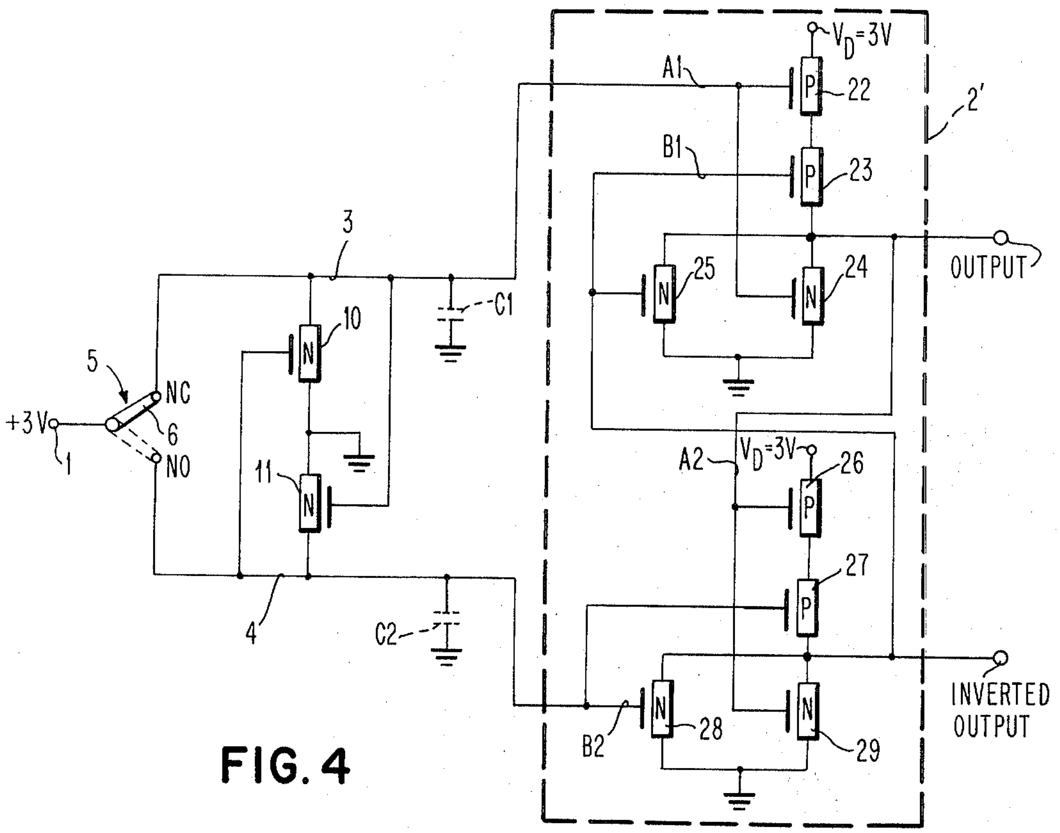
FIGS. 4 and 5 are embodiments of FIGS. 2 and 3, respectively, constructed entirely of CMOS devices.
Figure 5:
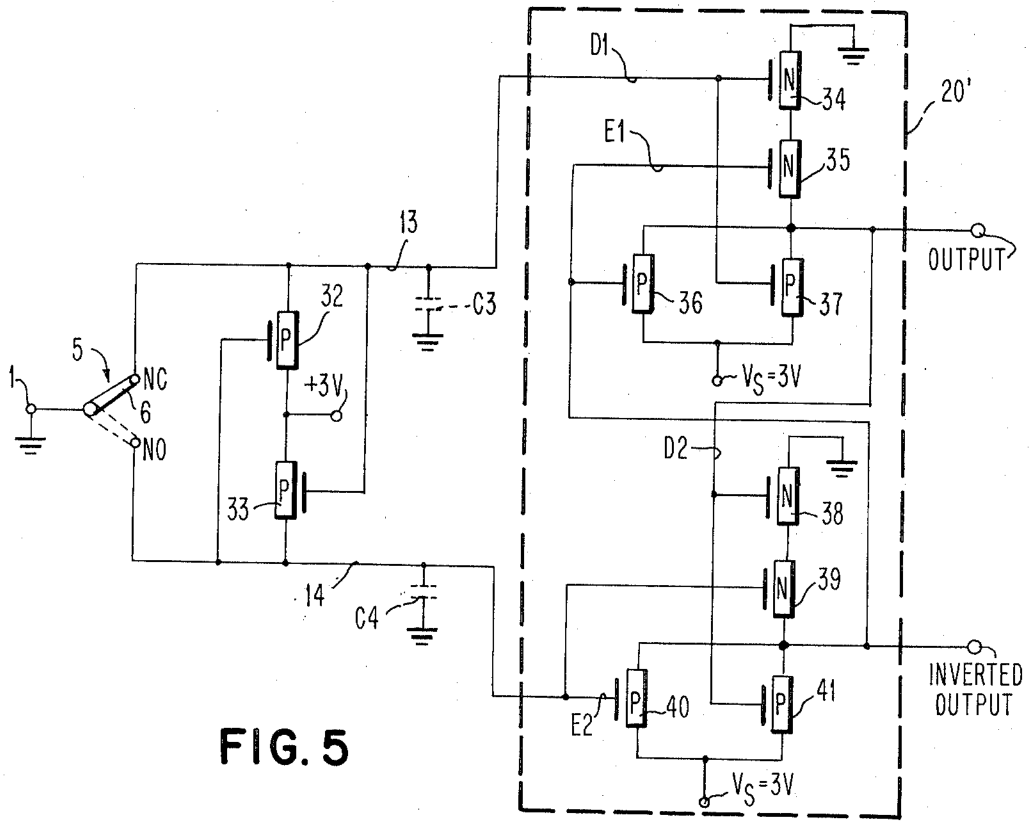

FIGS. 4 and 5 represent embodiments of my inventive circuit which, to my knowledge, dissipate the least amount of power of any contact bounce eliminator. The circuits are fabricated entirely from complementary metal oxide silicon (CMOS) field effect transistors. As such they are characterized by micropower quiescent operation, noise immunity and operation from a single power supply. In addition, the circuits of FIG. 4 and FIG. 5 can be fabricated in microminiature form on a single semiconductor substrate. Thus, they are easily incorporated in systems where space is at a premium, such as electronic watches and other small display units.

The CMOS circuits of FIGS. 4 and 5 correspond to the circuits of FIGS. 2 and 3, respectively. The devices within outlines 2′ and 20′ are pairs of crossconnected NOR and NAND circuits, respectively, of standard design. These NOR and NAND circuits have been described in the text entitled "COS/MOS Integrated Circuits Manual", RCA Technical Series CMS 271, 1972, pp. 24–27. I have found that CMOS (COS/MOS) NOR and NAND blocks are ideal for use in conjunction with my cross-coupled field effect transistors, principally because of the negligible power dissipation and ease of fabrication as integrated circuits.

Turning now to the operation of the circuit in FIG. 4, when strap 6 contacts terminal NC, P-channel transistor 22 is biased nonconductive and N-channel transistor 24 is biased conductive so that the output is at the ground potential. The ground signal on line A2 also turns P-channel transistor 26 on and maintains N channel transistor 29 nonconductive. The positive potential on line 3 also turns N channel transistor 11 on, thereby grounding terminal B2 to maintain N channel transistors 10 and 28 nonconductive and to cause P channel transistor 27 to conduct, thereby connecting the INVERTED OUTPUT to the positive supply $V_D$. In the quiescent state the circuit in FIG. 4 dissipates virtually no power except a miniscule amount of leakage current or that which may be required by the circuits connected to the output because there is no path from the positive potential to ground. The circuit remains D.C. stable. The same principles hold if strap 6 were connected to terminal NO, the only difference being that the signals on the outputs would be reversed due to the operation of the flip-flop 2'. A detailed discussion of this point is deemed unnecessary because, as already stated, these are adequately described in the RCA manual.

During transient operation, as when strap 6 switches from terminal NC to NO, transistor 11 remains conductive due to the potential stored in the stray capacitance C1. This condition remains until transistor 10 is turned on, and the charge on capacitor C1 is discharged to ground through transistor 10. As soon as C1 is discharged to one threshold above ground transistor 11 turns off and transistor 10 remains conductive maintaining node A1 at ground. However, there is no significant current flow as there is no connection from potential source +3V to ground.

In FIG. 5, which illustrates a pair of cross-coupled P channel transistors 32 and 33 connected across the inputs of a pair of CMOS NAND gates which comprise flip-flop 20', the potential connections have been reversed so that switch 5 is directly connected to ground through node 1 rather than a positive potential. The important consideration here, of course, is that the connection to the gates of transistors 32 and 33 be lower than the potential connected to the source of the transistor. In other words, the potential difference is the important consideration, rather than the absolute values of the voltage sources.

In operation, with terminal NC connected to ground, transistor 33 is conductive and transistor 32 is nonconductive. Thus terminal D1 is at ground potential and terminal E2 is at +3V. Transistor 37 is rendered conductive thereby connecting $V_S = 3V$ to the OUTPUT lead. The positive potential through transistor 33 renders line E2 positive which, in turn, turns on transistor 39 and holds transistor 40 off. Transistor 38 is also turned on through line D2, thereby causing the ground potential to be connected to the inverted output, i.e., a logical 0. Transistor 41 is off, with strap 6 connected to NO rather than NC, the signals on the OUTPUT and INVERTED OUTPUT lines are in reverse polarity.

During the transit time when switching from NC to NO, line 13 is left floating at ground until strap 6 makes contact with NO, thereby turning transistor 32 on. This charges node D1 to +3V. Transistor 32 remains on but conducts only until capacitor C3 is charged and then conducts virtually no current. Transistor 33 conducts until node D1 is charged to within one threshold of 3 volts. With transistor 33 off, current flow from the +3V source potential to ground is blocked.

For any period during which strap 6 bounces or chatters, thereby causing an open connection between node 1 and both terminals NC and NO, the OUTPUT and INVERTED OUTPUT lines remain in their set states. For example, if the circuit were initially set in the NC position, i.e., strap 6 connecting ground to terminal NC and then strap 6 disconnected the ground terminal 1, transistor 37 remains conductive due to the potential at C3. Node E2 remains in its set state. Therefore, all inputs to flip-flop 20' remain as is and the outputs are unchanged.

Figure 6:
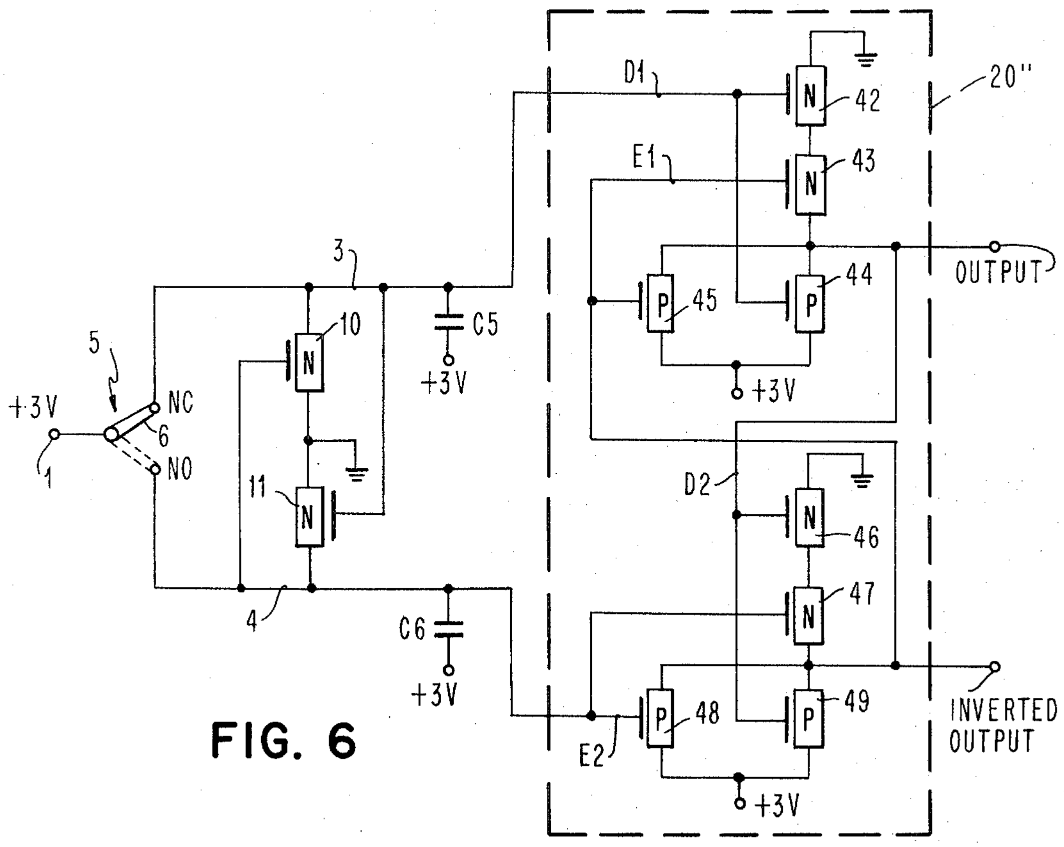
FIGS. 6 and 7 are alternative embodiments of my invention constructed entirely of CMOS devices.
Figure 7:
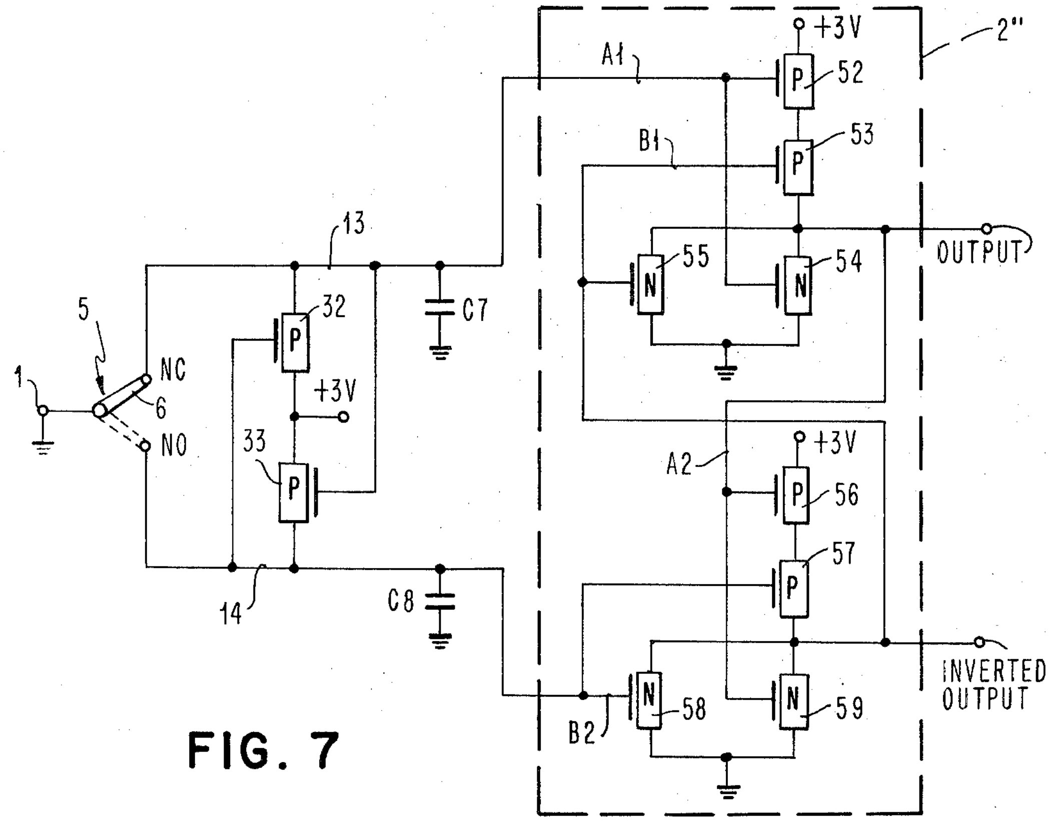

FIGS. 6 and 7 are illustrations of variations of my invention in which N-channel cross-coupled devices can be used with a pair of cross connected NAND gates fabricated in CMOS logic and P-channel devices can be used with cross-coupled NOR gates in CMOS logic. In general, FIGS. 6 and 7 would be less desirable to use than the circuits of FIGS. 4 and 5. Capacitors must be incorporated at the input nodes because without them contact bouncing could cause changes at the output lines. However, the circuits are of interest because they show that cross-connected NAND gates can be used as a bounce eliminator with the positive input required to operate N-channel cross-coupled transistors; and cross-connected NOR gates can be used as a bounce eliminator with the negative input required to operate P-channel cross-coupled transistors.

In FIG. 6, a pair of cross-coupled N-channel field effect transistors 10 and 11 are connected across the inputs of flip-flop 20'' which comprises cross connected NAND gates. Capacitor C5 is connected from input lead 3 to a source of positive potential at 3 volts and capacitor C6 is connected from lead 4 to a potential source at 3 volts. All of the connections in FIG. 6 shown at 3 volts are preferably connected to the same potential source. It is noted at this point that capacitors C5 and C6 could also be connected to ground without significantly affecting circuit operation.

In operation, with strap 6 connecting the input +3 volts at node 1 to contact NC, input D1 is at +3 volts to render N-channel transistor 42 conductive and P-channel transistor 44 nonconductive. The positive signal on line 3 also renders N-channel transistor 11 conductive, thereby grounding input E2 which renders P-channel transistor 48 conductive and N-channel transistor 47 nonconductive. Thus, the INVERTED OUTPUT is at +3 volts, a logical 1. This signal also renders N-channel transistor 43 conductive and transistor 45 nonconductive through line E1 so that the OUTPUT lead is at ground through transistors 42 and 43. At this point the circuit is stable. A similar analysis could be given for the state where strap 6 contacts node NO. In that case, the output signals would be reversed from the above and also stable.

A problem arises, however, if strap 6 were to bounce from terminal NC, thereby disconnecting +3V at node 1 from lead 3. In that situation, without the provision of capacitor C5, transistors 11 and 42 could be rendered nonconductive; and the OUTPUT line would no longer be at ground level. The reason for this is that node D1 would have a tendency to float toward ground potential due to leakage of the device 10 or other leakage paths. Transistor 42 would then turn off and P-channel transistor 44 turns on, switching the potential on the OUTPUT from ground to +3V. It will be appreciated that this would destroy the effectiveness of the entire circuit because the OUTPUT and inverted OUTPUT would no longer be out of phase. A similar problem occurs if strap 6 bounces from contact NO.

These problems are alleviated by specifically designing capacitors C5 and C6 into the system. The capacitance might be provided by stray capacitance which is always present in field effect transistors. Alternatively, if the stray capacitance is insufficient, a discrete capacitor fabricated within the integrated circuit structure may be provided. In either case, capacitors C5 and C6 tend to oppose any change in potential at nodes D1 and E2, respectively, during the transit time of strap 6. This opposition occurs irrespective of whether the capacitors are connected to +3V, as shown, or ground potential.

As an illustration of the operation of the capacitors, assume that node 1 contacts terminal NC through strap 6, thereby applying +3 volts to terminal D1. When strap 6 is disconnected from NC, C5 acts to impair the discharge of input D1 to ground. C5 is connected to +3V, rather than to a ground potential, because any leakage of current through C5 would offset any potential change at node 3 through transistor 10 which would cause instability at node 3. The same principles hold for capacitor C6. The principal function of the capacitors is to delay current charging or discharging; and the capacitors perform this function whether they are returned to a positive or ground potential.

As will be obvious to one of skill in the art who has read the previous sections of the specification, the value of the capacitors may be calcuated in a relatively straightforward manner to offset leakage from the cross-coupled transistors during the transit time of strap 6 from one contact to another. In general, the capacitors C5 and C6 would be equi-valued, assuming that leakage current from transistors 10 and 11 is the same and the circuit is in all other respects symmetrical. The transit time, which is critical, is the time it takes for strap 6 to finally leave contact NC upon actuation of switch 5 to the first instant of contact at terminal NO. As is known to those of familiarity with mechanical switches of the type used in watches and other calculators, the strap will bounce back and forth from contact NC upon initial actuation prior to finally moving from NC to NO. In addition, upon touching NO the contact will bounce until attaining a stable state. The bounce eliminator circuit is insensitive to these bounces. However, if the aforementioned transit time is of sufficient duration, then the circuit could become unstable. For example, the potential at D1 might be lowered sufficiently during the transit time to cause P-channel transistor 44 to begin to conduct and meanwhile maintaining N-channel transistor 42 conductive. This would result in a significant power output, causing the entire circuit to "hang up" in the high current state, without the provision of capacitor C5. The value of C5, then, is chosen to maintain the potential at above the threshold level of the P-channel transistors during the transit time. If, for example, leakage current of transistor 10 were 10 nanoamperes, a typical value of leakage current from integrated circuit N-channel transistors, and the transit time were around 5 milliseconds, then the capacitor would have a value of 100 pf. to allow a decay of 0.5 volts during the 5 milliseconds. This decay to 2.5 volts would ordinarily be insufficient to turn P-channel transistor 44 on or N-channel transistor 42 off.

In FIG. 7, a pair of cross-coupled P-channel field effect transistors 32 and 33 are connected across the inputs of flip-flop 2'' which comprises cross-connected NOR gates. Capacitor C7 is connected from input lead 13 to a source of ground potential and capacitor C8 is connected from lead 14 to ground potential.

In operation, with strap 6 connecting the input ground source at node 1 to contact NC, input A1 is at ground to render P-channel transistor 52 conductive and N-channel transistor 54 nonconductive. The signal on line 13 also renders P-channel transistor 33 conductive, thereby connecting +3V to input B2 which renders N-channel transistor 58 conductive and P-channel transistor 57 nonconductive. Thus, the inverted OUTPUT is at ground, a logical 0, through transistor 58. This signal also renders P-channel transistor 53 conductive and transistor 55 nonconductive through line B1 so that the output lead is at +3V through transistors 52 and 53. At this point the circuit is stable. A similar analysis could be given for the state when strap 6 contacts node NO. In that case the output signals would be reversed from the above and also stable.

A similar problem to that discussed above with respect to FIG. 6 occurs, however, if strap 6 were to bounce from terminal NC, thereby disconnecting the ground source at node 1 from lead 13. In that situation, without the provision of capacitor C7, transistors 33 and 52 could be rendered nonconductive; and the OUTPUT line would no longer be at +3V. This is because node A1 would have a tendency to float toward +3V due to leakage of the devices 32 or other leakage paths. Transistor 52 would turn off and P-channel transistor 54 on, switching the potential on the OUTPUT from +3V to ground. A similar problem of in-phase outputs occurs if strap 6 bounces from contact NO.

As with the circuit in FIG. 6, these problems are alleviated by specifically designing capacitors C7 and C8 into the system. The capacitance might be provided by stray capacitance which is always present in field effect transistors. Alternatively, if the capacitance is insufficient, a discrete capacitor fabricated within the integrated circuit structure may be provided. In either case capacitors C7 and C8 tend to oppose any change in potential at nodes A1 and B2 respectively, during the transit time of strap 6.

The operation of the capacitors is similar to the operation of capacitors C5 and C6 already described in detail with regard to FIG. 6. Hence further description would be redundant.

In summary, I have described a bounce eliminator circuit suitable for use in low power systems such as electric watches and other small display units. The great advantage of my circuit over prior art circuits is that virtually no power is dissipated while the circuit is in the quiescent state.

Whereas the invention has been described with a certain degree of particularity, it is understood that the present disclosure has been made only by way of example and that numerous changes in the details of construction and the combination and arrangement of parts and the mode of operation may be made without departing from the spirit and the scope of the invention as hereinafter claimed.

What is claimed is:

1. A circuit for producing a single output pulse in response to the closing of a mechanical switch comprising:

a flip-flop circuit including two inputs;

a source of potential selectively connectible to either one of said inputs; and cross-coupled field effect transistor means, responsive to said potential source and connected across said inputs, for discharging an input when said potential is switched from one input to another, said transistor means dissipating virtually no power when said circuit is in the quiescent state.

2. A circuit as in claim 1 wherein said potential source is positive and said transistors are of the N-channel type.

3. A circuit as in claim 2 wherein said flip-flop comprises cross-connected NOR gates.

4. A circuit as in claim 1 wherein said potential source is negative and said transistors are of the P-channel type.

5. A circuit as in claim 4 wherein said flip-flop comprises cross-connected NAND gates.

6. A circuit as in claim 1 further comprising:

mechanical switching means having first and second contacts respectively connected to said two inputs and a third contact connected to said source of potential for supplying potential alternately to said first and second contacts.

7. A circuit as in claim 6 wherein said switching means is a break-before-make switch.

8. A contact bounce eliminator circuit which can be fabricated on a single semiconductor substrate and which draws virtually no power when said circuit is in the quiescent state comprising:

a pair of logic gates operative as a flip-flop circuit, each said logic gate constructed from complementary metal oxide semiconductor field effect transistors;

each said gate having an input;

a source of potential selectively connectible to either one of said inputs; and a pair of field effect transistors of the same conductivity type connected in cross-coupled fashion across said inputs.

9. A circuit as in claim 8 wherein:

each said logic gate is a NOR circuit;

said source of voltage is positive; and the conductivity of said pair of field effect transistors is N type.

10. A circuit as in claim 8 wherein:

each said logic gate is a NAND circuit;

said source of voltage is negative; and the conductivity of said pair of field effect transistors is P type.

11. A circuit as in claim 8 wherein:

each said logic gate is a NOR circuit;

said source of voltage is negative;

the conductivity of said pair of field effect transistors is P type; and further comprising:

capacitance means connected at each said input for opposing changes in potential at said inputs when said potential source is unconnected to either of said inputs.

12. A circuit as in claim 8 whererein:

each said logic gate is a NAND circuit;

said source of voltage is positive;

the conductivity of said pair of field effect resistors is N type; and further comprising:

capacitance means connected at each said input for opposing changes in potential at said inputs when said potential source is unconnected to either of said inputs.

13. A contact bounce eliminator circuit comprising:

circuit means including a pair of inputs and a pair of outputs for generating complementary signals on said outputs;

potential means selectively connectible to either one of said inputs for reversing the signals on said outputs; and first and second field effect transistors, the gate electrode of said first transistor and the output electrode of said second transistor being connected to one of said input pair and the gate electrode of said second transistor and the output electrode of said first transistor being connected to the other of said input pair, the input electrodes of said first and second transistors being connected to a reference potential, whereby virtually no current flows between said potential means and said reference potential while said bounce eliminator circuit is in the quiescent state.

* * * * *